US009318689B2

(12) United States Patent
Watanabe et al.

(10) Patent No.: US 9,318,689 B2
(45) Date of Patent: Apr. 19, 2016

(54) SODIUM NIOBATE POWDER, METHOD OF MANUFACTURING A SODIUM NIOBATE POWDER, PLATE-LIKE PARTICLE, METHOD OF MANUFACTURING A PLATE-LIKE PARTICLE, AND METHOD OF MANUFACTURING AN ORIENTED CERAMICS

(75) Inventors: Takayuki Watanabe, Yokohama (JP); Hiroshi Saito, Kawasaki (JP); Jumpei Hayashi, Yokohama (JP); Nobuhiro Kumada, Kofu (JP)

(73) Assignees: CANON KABUSHIKI KAISHA, Tokyo (JP); UNIVERSITY OF YAMANASHI, Kofu-Shi (JP)

( * ) Notice: Subject to any disclaimer, the term of this patent is extended or adjusted under 35 U.S.C. 154(b) by 0 days.

(21) Appl. No.: 14/117,995

(22) PCT Filed: May 17, 2012

(86) PCT No.: PCT/JP2012/063238
§ 371 (c)(1), (2), (4) Date: Nov. 15, 2013

(87) PCT Pub. No.: WO2012/165267
PCT Pub. Date: Dec. 6, 2012

(65) Prior Publication Data
US 2014/0106170 A1   Apr. 17, 2014

(30) Foreign Application Priority Data
May 27, 2011  (JP) .................................. 2011-119009

(51) Int. Cl.
*C04B 35/495*  (2006.01)
*H01L 41/187*  (2006.01)
(Continued)

(52) U.S. Cl.
CPC ............ *H01L 41/1873* (2013.01); *B32B 18/00* (2013.01); *C01G 33/00* (2013.01); (Continued)

(58) Field of Classification Search
CPC ..................... C04B 35/495; C04B 2235/3255; C04B 2235/5292; C04B 2235/5296; C04B 2235/3436; B28B 3/022
See application file for complete search history.

(56) References Cited

U.S. PATENT DOCUMENTS 2,888,731 A * 6/1959 McElroy et al. ............... 425/421
5,026,438 A * 6/1991 Young ................... H01F 1/0576
148/101

(Continued)

FOREIGN PATENT DOCUMENTS

CN   101597165 A   12/2009
CN   101696035 A   4/2010
(Continued)

OTHER PUBLICATIONS

JP 2009-040672 A (Yokoyama et al.) Feb. 26, 2009 (English language machine translation of document cited on IDS dated Nov. 20, 2013). [online] [retrieved Mar. 28, 2015]. Retrieved from: Japan Patent Office Advanced Industrial Property Network.*
(Continued)

*Primary Examiner* — Erin Snelting
(74) *Attorney, Agent, or Firm* — Fitzpatrick, Cella, Harper & Scinto

(57) ABSTRACT

Provided are methods of manufacturing an oriented ceramics containing sodium niobate and a raw material thereof. Specifically, provided is a sodium niobate powder, including cuboidal sodium niobate particles having an average side length of 0.1 μm or more to 100 μm or less, at least one face of the cuboid including a (100) plane in pseudo-cubic notation, in which the sodium niobate powder has a perovskite single-phase structure.

2 Claims, 8 Drawing Sheets

(51) Int. Cl.
  *B28B 1/08* (2006.01)
  *B32B 18/00* (2006.01)
  *C01G 33/00* (2006.01)
  *C04B 35/26* (2006.01)
  *C04B 35/462* (2006.01)
  *C04B 35/468* (2006.01)
  *C04B 35/475* (2006.01)
  *C04B 35/626* (2006.01)

(52) U.S. Cl.
  CPC .............. *C04B 35/26* (2013.01); *C04B 35/462* (2013.01); *C04B 35/4682* (2013.01); *C04B 35/475* (2013.01); *C04B 35/495* (2013.01); *C04B 35/62665* (2013.01); *C04B 35/62685* (2013.01); *C01P 2002/34* (2013.01); *C01P 2002/72* (2013.01); *C01P 2002/74* (2013.01); *C01P 2004/03* (2013.01); *C01P 2004/20* (2013.01); *C01P 2004/54* (2013.01); *C04B 2235/3201* (2013.01); *C04B 2235/3215* (2013.01); *C04B 2235/3234* (2013.01); *C04B 2235/3236* (2013.01); *C04B 2235/3251* (2013.01); *C04B 2235/3255* (2013.01); *C04B 2235/3281* (2013.01); *C04B 2235/3298* (2013.01); *C04B 2235/5292* (2013.01); *C04B 2235/5296* (2013.01); *C04B 2235/5427* (2013.01); *C04B 2235/5436* (2013.01); *C04B 2235/5445* (2013.01); *C04B 2235/5463* (2013.01); *C04B 2235/604* (2013.01); *C04B 2235/6025* (2013.01); *C04B 2235/768* (2013.01); *C04B 2235/787* (2013.01); *C04B 2235/81* (2013.01); *C04B 2237/345* (2013.01); *Y10T 428/2982* (2015.01)

(56) References Cited

U.S. PATENT DOCUMENTS

| | | |
|---|---|---|
| 5,721,182 A | 2/1998 | Reichert et al. |
| 6,387,295 B1 | 5/2002 | Saito |
| 6,767,503 B2 | 7/2004 | Ogawa et al. |
| 7,700,067 B2 | 4/2010 | Yokoyama et al. |
| 7,931,821 B2 | 4/2011 | Saito et al. |
| 8,084,924 B2 | 12/2011 | Yura et al. |
| 8,158,255 B2 | 4/2012 | Yokoyama et al. |
| 8,211,328 B2 | 7/2012 | Yura et al. |
| 8,212,455 B2 | 7/2012 | Yura et al. |
| 8,367,205 B2 | 2/2013 | Yura et al. |
| 8,547,001 B2 | 10/2013 | Saito et al. |
| 8,632,723 B2 | 1/2014 | Watanabe et al. |
| 8,920,924 B2 | 12/2014 | Muramatsu et al. |
| 2002/0195750 A1 | 12/2002 | Ogawa et al. |
| 2004/0176254 A1 | 9/2004 | Ogawa et al. |
| 2008/0248277 A1 | 10/2008 | Yokoyama et al. |
| 2011/0297870 A1 | 12/2011 | Matsuda et al. |
| 2012/0064344 A1 | 3/2012 | Muramatsu et al. |
| 2012/0162319 A1 | 6/2012 | Hayashi et al. |
| 2013/0029181 A1 | 1/2013 | Matsuda et al. |
| 2013/0056671 A1 | 3/2013 | Kubota et al. |
| 2013/0200750 A1 | 8/2013 | Watanabe et al. |
| 2013/0335488 A1 | 12/2013 | Watanabe et al. |
| 2014/0103246 A1 | 4/2014 | Muramatsu et al. |
| 2014/0125204 A1 | 5/2014 | Matsuda et al. |
| 2014/0152144 A1 | 6/2014 | Watanabe et al. |

FOREIGN PATENT DOCUMENTS

| | | |
|---|---|---|
| EP | 1 253 121 A2 | 10/2002 |
| JP | 8-301618 A | 11/1996 |
| JP | 2000-313664 A | 11/2000 |
| JP | 2005-272266 A | 10/2005 |
| JP | 2009-40672 A | 2/2009 |
| JP | 2010-241658 A | 10/2010 |
| JP | 2010-241659 A | 10/2010 |
| KR | 10-2002-0085800 A | 11/2002 |
| WO | 2010/116972 A1 | 10/2010 |
| WO | 2010/116975 A1 | 10/2010 |
| WO | 2012/165643 A1 | 12/2012 |

OTHER PUBLICATIONS

Office Action in Chinese Application No. 201280024864.6 (dated Sep. 15, 2014).

Yasuyoshi Saito et al., "Lead-Free Piezoceramics," 432 Nature 84-87 (Oct. 2004).

Yunfei Chang et al., "Phase Structure, Morphology, and Raman Characteristics of NaNbO3 Particles Synthesized by Different Methods," 44(3) Materials Research Bulletin 538-542 (Aug. 2008) (XP002684631).

Liang Ji et al., "Polymorphology of Sodium Niobate Based on Two Different Bidentate Organics," 45(3) Materials Research Bulletin 314-317 (Dec. 2009) (XP002684632).

Yasuyoshi Saito et al., "Synthesis of Polycrystalline Platelike NaNbO3 Particles by the Topochemical Micro-Crystal Conversion from K4Nb6O17 and Fabrication of Grain-Oriented (K0.5Na0.5)NbO3 Ceramics", 24(1) J. Electroceram 39-45 (Nov. 2008) (XP019790498).

Second Office Action in Chinese Application No. 201280024864.6 (issued May 18, 2015).

Notice of Preliminary Rejection in Korean Application No. 10-2013-7033666 (mailed Mar. 23, 2015).

Notification of Reasons for Refusal in Japanese Application No. 2011-119009 (issued Sep. 29, 2015).

* cited by examiner

*FIG. 4A*      *FIG. 4B*
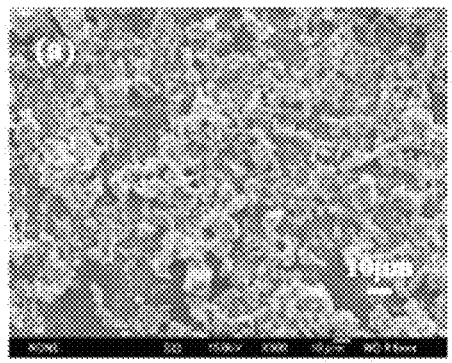 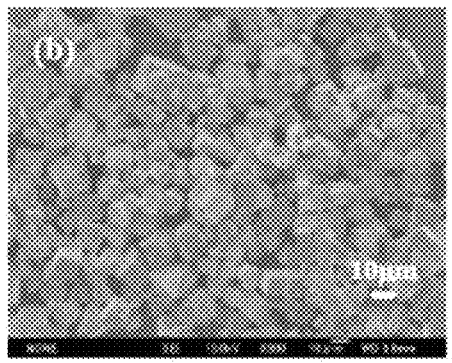
*FIG. 4C*      *FIG. 4D*
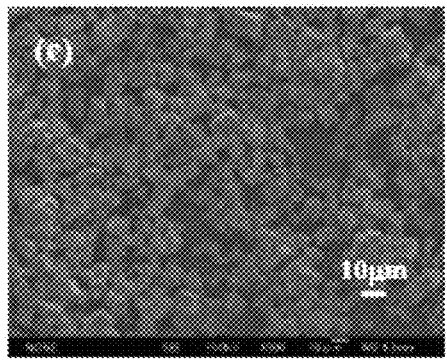 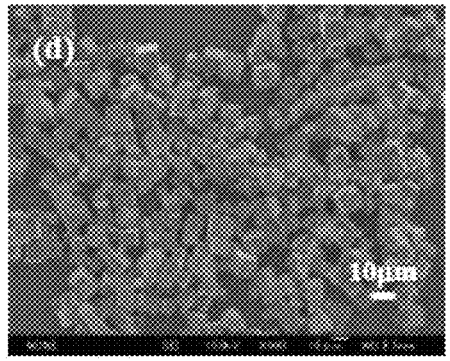

FIG. 5A
FIG. 5B
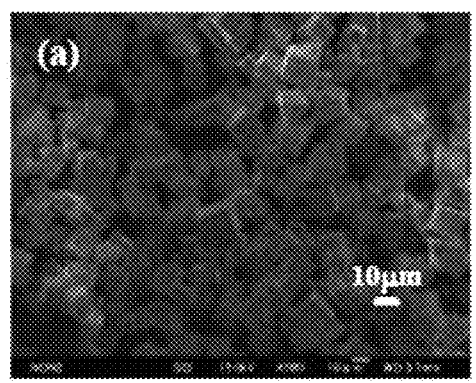
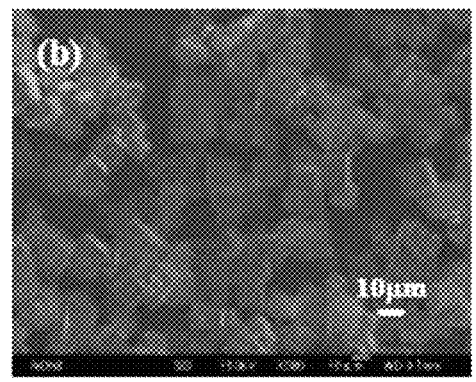
FIG. 6
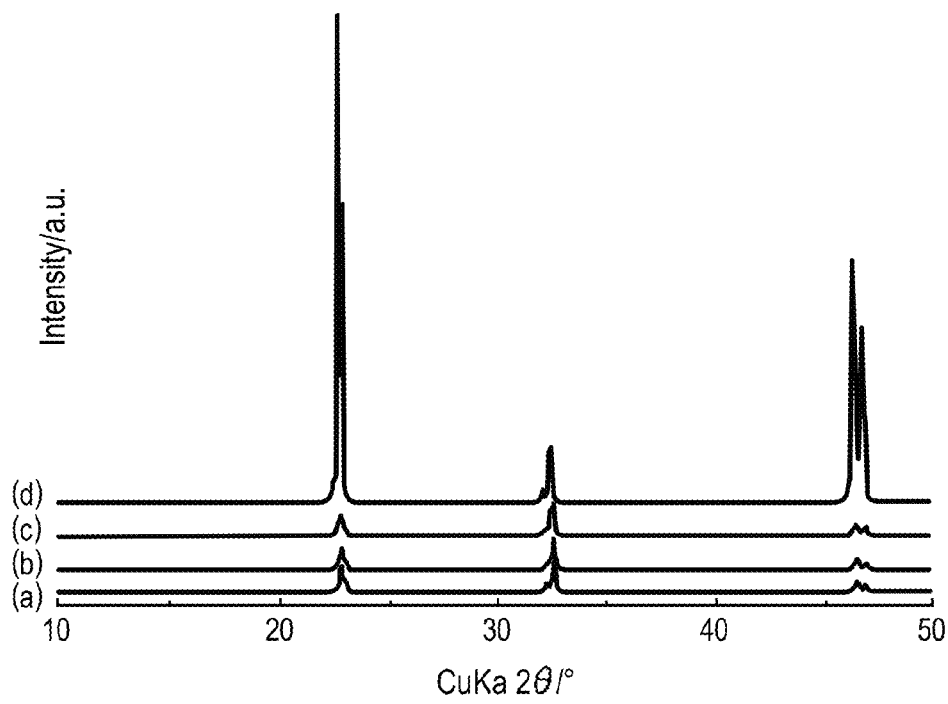

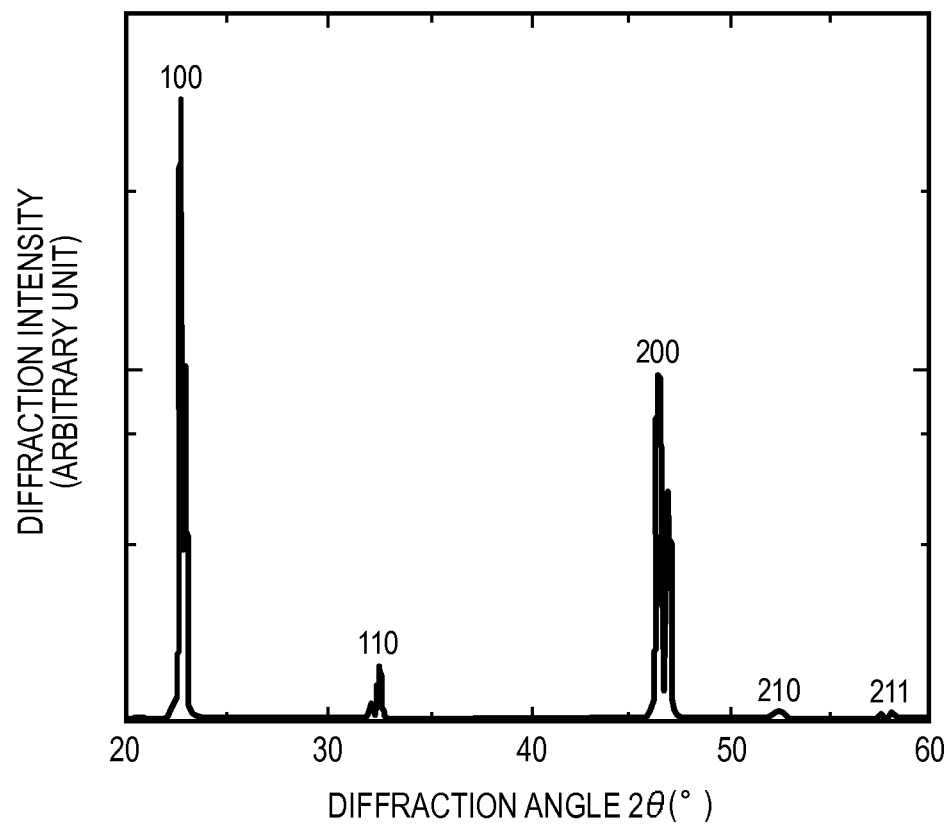

US 9,318,689 B2

SODIUM NIOBATE POWDER, METHOD OF MANUFACTURING A SODIUM NIOBATE POWDER, PLATE-LIKE PARTICLE, METHOD OF MANUFACTURING A PLATE-LIKE PARTICLE, AND METHOD OF MANUFACTURING AN ORIENTED CERAMICS

TECHNICAL FIELD

The present invention relates to a sodium niobate powder containing a cuboidal sodium niobate particle and a method of manufacturing the sodium niobate powder. The present invention also relates to a plate-like particle, which is manufactured using the cuboidal sodium niobate particle, a method of manufacturing the plate-like particle, and a method of manufacturing an oriented ceramics.

BACKGROUND ART

First, terms used herein are described below. In this description, sodium niobate (general formula: $NaNbO_3$) is hereinafter referred to as NN. Further, NN is originally an orthorhombic, but is regarded as a pseudo-cubic for the sake of simplicity of expression. Unless otherwise specified, a crystal orientation, a crystal plane, an orientation, and an X-ray diffraction index of NN are described in pseudo-cubic notation. A solid solution of NN and barium titanate (general formula: $BaTiO_3$) and a solid solution of NN and potassium niobate (general formula: $KNbO_3$) each adopt any one of monoclinic, orthorhombic, cubic, and tetragonal crystal systems, or simultaneously adopt a plurality of these crystal systems depending on compositions. For the sake of simplicity of expression, however, the solid solution of NN and barium titanate, the solid solution of NN and potassium niobate, and other perovskite-type materials are also discussed as pseudo-cubics as is the case with NN unless otherwise specified.

It has been known in recent years that an NN-containing oxide such as the solid solution of NN and barium titanate or the solid solution of NN and potassium niobate is a promising lead-free piezoelectric material having a low environmental impact. Further, in general, piezoelectric performance of a piezoelectric ceramics can be improved by controlling crystal orientation.

According to Non Patent Literature 1, a plate-like NN particle is produced by a topochemical micro-crystal conversion (hereinafter, referred to as TMC) method. Then, an oriented ceramics containing NN as a component is produced by a doctor blade method using a slurry containing the plate-like NN particle.

Patent Literature 1 discloses a method of producing a plate-like particle by a technique other than the TMC method. A solid state reaction is employed to produce a cuboidal particle in which an A site of NN is partially substituted with Li, K, or the like and a B site thereof is partially substituted with Ta or the like, and a plate-like particle is then produced by a doctor blade method using a slurry containing the cuboidal particle.

As a method of producing a cuboidal NN particle by a technique other than a solid state reactionstate reaction, Patent Literature 2 discloses that a cuboidal NN particle can be synthesized by a solvothermal method.

CITATION LIST

Non Patent Literature

NPL 1: "Y. Saito et al., Nature," 2004, Vol. 432, pp. 84-87

Patent Literature

PTL 1: Japanese Patent Application Laid-Open No. 2009-40672
PTL 2: Japanese Patent Application Laid-Open No. 2010-241658

SUMMARY OF INVENTION

Technical Problem

However, when the plate-like NN particle is produced using the TMC method, the particle needs to be produced via an unintended composition. It is therefore difficult to produce an impurity-free plate-like NN particle.

Further, it is difficult to directly synthesize a plate-like NN particle or a cuboidal NN particle by the solid state reaction without substitution of Na or Nb of NN with another element.

In addition, in the conventional hydrothermal synthesis, it is difficult to synthesize a dispersed cuboidal NN particle with a perovskite single-phase structure free of impurities. In an X-ray diffraction pattern in Patent Literature 2, a diffraction peak attributed to an impurity phase can be found. Further, there is a need of using a niobium halide which is hard to handle and is high in cost as a raw material for synthesizing the NN particle.

Hitherto, there have not been known a plate-like or cuboidal NN particle, which is free of any impurity element and impurity phase and is dispersed, and a method of manufacturing the NN particle.

The present invention has been made for solving such problems and provides a method of manufacturing an NN-containing oriented ceramics and a raw material thereof. The present invention also provides a plate-like particle, which is manufactured using a cuboidal NN particle, a method of manufacturing the plate-like particle, and a method of manufacturing an oriented ceramics using a cuboidal particle.

Solution to Problem

A first exemplary embodiment of the present invention for solving the problems is an NN powder, including a cuboidal NN particle having an average side length of 0.1 μm or more to 100 μm or less, at least one face of the cuboid including a (100) plane, in which the NN powder has a perovskite single-phase structure.

A second exemplary embodiment of the present invention is a plate-like particle, including: the cuboidal NN particle; and an organic binder, in which: the plate-like particle has an aspect ratio of a width to a thickness (width/thickness) of 3 or more; and the plate-like particle is (100)-oriented.

A third exemplary embodiment of the present invention is a method of manufacturing an NN powder, including holding an aqueous dispersion liquid containing sodium hydroxide and amorphous niobium oxide hydrate in an atmosphere at a pressure of more than 0.1 MPa and a temperature of 141 to 260° C. for 1 to 100 hours.

A fourth exemplary embodiment of the present invention is a method of manufacturing a plate-like particle, including: preparing a slurry containing the NN powder; and forming the slurry into a sheet by a doctor blade method with a gap width of 5 μm or more to 250 μm or less.

A fifth exemplary embodiment of the present invention is a method of manufacturing an oriented ceramics, including: filling a mold with a powder containing the plate-like particle; vibrating the mold; pressurizing the powder to produce a compact; and sintering the compact.

A sixth exemplary embodiment of the present invention is a method of manufacturing an oriented ceramics, including: subjecting the plate-like particle to a heat treatment to produce a plate-like inorganic particle; forming a slurry containing the plate-like inorganic particle into a sheet to produce green sheets; laminating the green sheets to produce a laminate; and sintering the laminate.

A seventh exemplary embodiment of the present invention is a method of manufacturing an oriented ceramics, including: forming a slurry containing the NN powder into a sheet to produce green sheets; laminating the green sheets to produce a laminate; and sintering the laminate.

An eighth exemplary embodiment of the present invention is a method of manufacturing an oriented ceramics, including: mounting a metal oxide powder containing a cuboidal metal oxide particle having an average side length of 1 μm or more to 1,000 μm or less on a substrate; vibrating the substrate; producing a compact from the powder; and sintering the compact.

Advantageous Effects of Invention

According to the present invention, it is possible to produce the plate-like or cuboidal NN particle free of impurities. Further, it is possible to provide the technology for orienting an NN-containing material. In addition, the method of producing an oriented ceramics according to the present invention is applicable to orientation control of various kinds of ceramics. In particular, when the method is employed in a lead-free piezoelectric ceramics, a burden on the environment is reduced, and besides, satisfactory piezoelectric property is exhibited.

Further features of the present invention will become apparent from the following description of exemplary embodiments with reference to the attached drawings.

BRIEF DESCRIPTION OF DRAWINGS

FIG. 2A shows a photograph at 0.5 M (Comparative Example 1), FIG. 2B shows a photograph at 1.0 M (Comparative Example 2), FIG. 2C shows a photograph at 2.0 M (Example 1), and FIG. 2D shows a photograph at 4.0 M (Example 2).

FIGS. 4A, 4B, 4C, and 4D show scanning electron microscope photographs of powders obtained by hydrothermal synthesis including using as raw materials $Nb_2O_5 \cdot nH_2O$ and a 4.0 M aqueous NaOH solution and keeping the raw materials at temperatures shown below for 24 hours. FIG. 4A shows a photograph at 140° C. (Comparative Example 3), FIG. 4B shows a photograph at 160° C. (Comparative Example 4), FIG. 4C shows a photograph at 180° C. (Example 2), and FIG. 4D shows a photograph at 200° C. (Example 3).

FIGS. 5A and 5B show scanning electron microscope photographs of powders obtained by hydrothermal synthesis including using as raw materials $Nb_2O_5 \cdot nH_2O$ and a 4.0 M aqueous NaOH solution and keeping the raw materials at 180° C. for time periods shown below. FIG. 5A shows a photograph in the case of keeping the raw materials for 48 hours (Example 4) and FIG. 5B shows a photograph in the case of keeping the raw materials for 96 hours (Example 5).

FIG. 6 shows X-ray diffraction patterns of powders obtained by hydrothermal synthesis including using as raw materials niobium raw materials shown below and a 4.0 M aqueous NaOH solution and keeping the raw materials at 180° C. for 24 hours. In the figure, (a) shows data in the case of using $Nb_2O_5$ (Comparative Example 5), (b) shows data in the case of using $HNbO_3 \cdot nH_2O$ (Comparative Example 6), (c) shows data in the case of using $HNb_3O_8 \cdot nH_2O$ (Comparative Example 7), and (d) shows data in the case of using $Nb_2O_5 \cdot nH_2O$ (Example 2).

FIG. 7A shows a photograph in the case of using $Nb_2O_5$ (Comparative Example 5), FIG. 7B shows a photograph in the case of using $HNbO_3 \cdot nH_2O$ (Comparative Example 6), and FIG. 7C shows a photograph in the case of using $HNb_3O_8 \cdot nH_2O$ (Comparative Example 7).

FIG. 11 shows an X-ray diffraction pattern of a NaNbO₃ oriented ceramic produced by applying vibration to the cuboidal NaNbO₃ particle of the present invention (Example 16).

DESCRIPTION OF EMBODIMENTS

Figure 1:
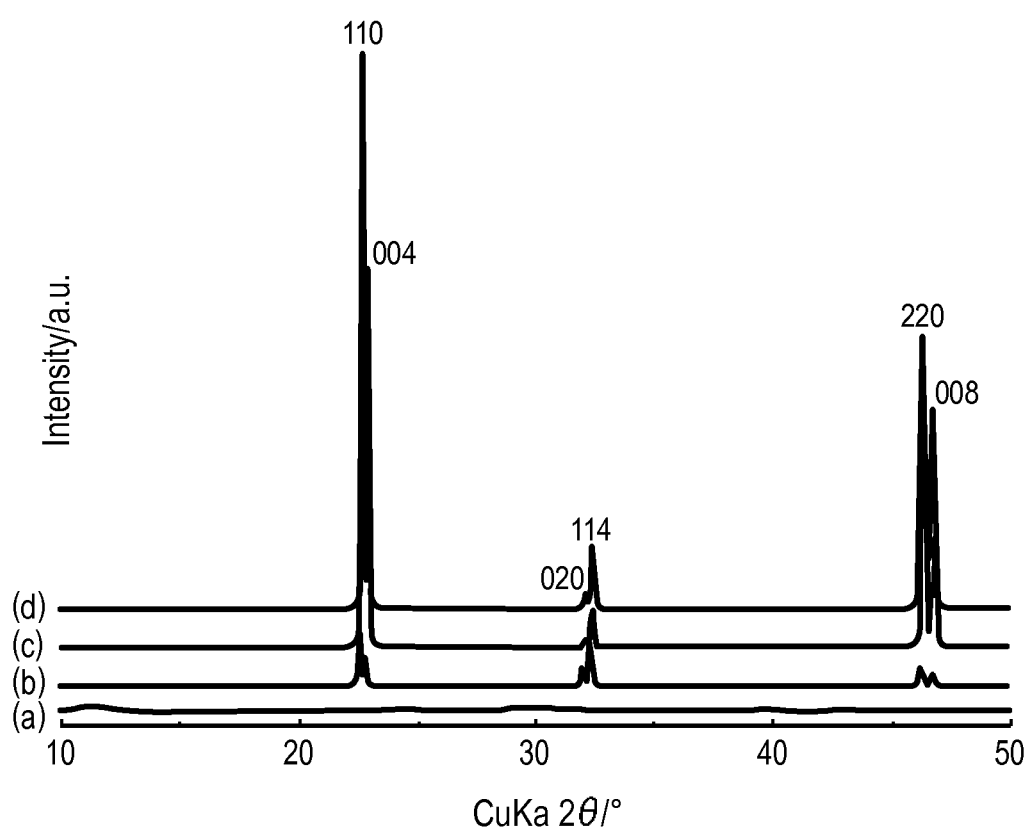
FIG. 1 shows X-ray diffraction patterns of powders obtained by hydrothermal synthesis including using as raw materials $Nb_2O_5 \cdot nH_2O$ and aqueous NaOH solutions at concentrations shown below and keeping the raw materials at 180° C. for 24 hours. In the figure, (a) shows data at 0.5 M (Comparative Example 1), (b) shows data at 1.0 M (Comparative Example 2), (c) shows data at 2.0 M (Example 1), and (d) shows data at 4.0 M (Example 2) (in the figure, diffraction indices are represented in orthorhombic notation).

Preferred embodiments of the present invention will now be described in detail in accordance with the accompanying drawings.

The present invention provides an NN powder, a plate-like particle, a method of manufacturing an NN powder, a method of manufacturing a plate-like particle, and a method of manufacturing oriented ceramics. It should be noted that a piezoelectric material of the present invention can be used in various applications such as capacitors, memories, and sensors by taking advantage of its dielectric features.

(1) Sodium Niobate Powder

An NN powder of the present invention includes an cuboidal NN particle having an average side length of 0.1 μm or more to 100 μm or less, at least one face of the cuboid including a (100) plane, in which the NN powder has a perovskite single-phase structure.

In the present invention, the terms "cuboid" or "cuboidal" refer to a parallelepiped shape in which an angle formed by faces falls within 90°±10°. The cuboid also encompasses a cubic shape. In addition, the cuboid also encompasses a partially defected cuboid and a cuboid having an irregular portion on any one of six faces. The NN particle is cuboidal, and hence the orientation of the cuboidal particle can be controlled by using it in a doctor blade method, applying vibration to the particle, or pressing the particle on a substrate. The average side length is an average of lengths of three sides which are unparallel with one another among 12 sides of one cuboidal particle. The NN powder containing an NN particle refers to an NN powder containing a large number of the NN particles of the present invention.

When the average side length of the cuboidal NN particle is less than 0.1 μm, the orientation control by the doctor blade method is difficult. The difficulty in the orientation control means that the obtained ceramics has a Lotgering factor of 10% or less.

A method of calculating the Lotgering factor employs the peak intensity of X-ray diffraction from a crystal plane of interest and calculates the Lotgering factor from Equation 2.

$$F=(\rho-\rho_0)/(1-\rho_0) \quad \text{(Equation 2)}$$

In the equation, $\rho_0$ is calculated using an X-ray diffraction intensity ($I_0$) of a non-oriented sample, and in the case of a (001)-oriented tetragonal crystal, is determined from Equation 3 as a ratio of the sum of diffraction intensities of the (001) plane with respect to the sum of all diffraction intensities.

$$\rho_0=\Sigma I_0(001)/\Sigma I_0(hkl) \quad \text{(Equation 3)}$$

(h, k, and l each represent an integer.)

$\rho$ is calculated using an X-ray diffraction intensity (I) of an oriented sample, and in the case of a (001)-oriented tetragonal crystal, is determined from Equation 4 in the same manner as in Equation 3 above as a ratio of the sum of diffraction intensities of the (001) plane with respect to the sum of all diffraction intensities.

$$\rho=\Sigma I(001)/\Sigma I(hkl) \quad \text{(Equation 4)}$$

On the other hand, when the average side length of the cuboidal NN particle is more than 100 μm, a sintered product with a sufficiently high sintered density is hardly obtained.

The sufficiently high sintered density refers to a relative density (measured density/theoretical density) of 90% or more.

Therefore, the average side length of the cuboidal NN particle is 0.1 μm or more to 100 μm or less. The average side length of the cuboidal NN particle is more preferably 0.1 μm or more to 20 μm or less. This is because composition uniformity within an NN-containing ceramics increases.

The average side length of the cuboidal NN particle is still more preferably 0.1 μm or more to 10 μm or less. This is because a sintered product having a higher density is obtained in the sintering of an NN-containing ceramics when the size of the cuboidal NN particle falls within the above-mentioned range.

At least one face of the cuboidal NN particle is a (100) plane. When one face of the cuboidal NN particle is (100), a (100)-oriented ceramics can be produced. The (100)-oriented ceramics means that a Lotgering factor representing a degree of (100) orientation is at least 10% or more.

When a crystal produced using the cuboidal NN particle is an orthorhombic ferroelectric material, the spontaneous polarization axis thereof is parallel to the [101] direction. Therefore, the application of an electric field in the [001] direction of the crystal forms an engineered domain structure in the crystal, causing an increase in piezoelectric performance. When the crystal is a tetragonal ferroelectric material, the spontaneous polarization axis thereof is parallel to the [001] direction. Therefore, the application of an electric field in the [001] direction of the crystal allows the spontaneous polarization in parallel to the electric field to be easily switched, causing an increase in piezoelectric performance. Therefore, the (100)-oriented ceramics is preferred.

When at least one face of the cuboidal NN particle is not a (100) plane, the crystal orientation of the cuboidal NN particle may vary depending on faces of the cuboid. Therefore, the production of an oriented ceramics is difficult.

Several simple methods can be employed to investigate what kind of crystal orientation the face of the cuboidal NN particle of the present invention has. For example, an NN powder is scattered on a smooth glass substrate, and vibration is applied to the glass substrate for several seconds to several minutes at a magnitude just enough to confirm that the NN powder is being vibrated by visual observation. The NN particle of the present invention is cuboidal, and hence the particle moves in a state in which one face of the cuboid is brought into contact with a face of the glass substrate. Then, the crystal orientation of the NN particle placed on the glass substrate was investigated by X-ray diffraction. When the relative diffraction intensity of 101/040 or 202/080 (In this case, the index is presented in an orthorhombic notation. 101/040 and 202/080 are 100 and 200 in pseudo-cubic notation, respectively.) is high in comparison with a powder diffraction file (for example, ICDD No. 33-1270), it can be judged that at least one face of the cuboidal NN particle is a (100) plane. The evaluation of a relationship between the face and the crystal orientation of the cuboid through the use of a transmission electron microscope can also reveal the crystal plane that is parallel to the face of the cuboidal NN particle.

The NN powder has a perovskite single-phase structure. When the NN powder is not a perovskite single phase, a composition ratio between sodium and niobium may deviate from a stoichiometric ratio by 10% or more. Alternatively, the synthesis of the NN particle might not proceed sufficiently, with the result that unreacted raw materials may remain in the NN powder. The production of a piezoelectric material using an NN powder having no perovskite single-phase structure is not preferred because contamination with an impurity phase occurs, resulting in a decrease in piezoelectric performance, non-uniform sintering, or the like.

A fact that the NN powder has a perovskite single-phase structure is determined based on whether or not particles in the NN powder are of a perovskite-type on average. A fact that the NN powder has a perovskite single-phase structure can be determined from a diffraction pattern obtained by 2θ-θ measurement of general powder X-ray diffraction using a copper tube. The NN powder is pulverized if needed. When 96% or more of diffraction peaks detected at diffraction angles of 10 to 80 degrees can be attributed to the peaks described in ICDD 33-1270, the powder is determined to have a perovskite single-phase structure. In particular, the powder can be determined to have a perovskite single-phase structure when a diffraction peak having a higher intensity than the 131 diffraction of NN (index notation follows the card) is not detected in the range of diffraction angles of 28 to 30 degrees.

The NN powder is preferably represented by the following general formula (1).

$$Na_{1+x}NbO_{3+x/2} (-0.1 \leq x \leq 0.1) \qquad \text{General formula (1)}$$

In the general formula (1), when x does not fall within the range of $-0.1 \leq x \leq 0.1$, the NN powder does not have a perovskite single-phase structure.

Further, when a ceramics is sintered using the NN powder as a raw material, Na in the NN powder may evaporate. Therefore, x of more than 0 is preferred because an evaporated part of Na can be supplied in advance. In addition, x of more than 0 and 0.05 or less is preferred because the NN powder has a perovskite single-phase structure and an evaporated part of Na in a sintering process can be supplied.

An aspect ratio ($L_{max}/L_{min}$) of the longest side length $L_{max}$ to the shortest side length $L_{min}$ of the NN particle in the NN powder is preferably 3 or less on average.

The aspect ratio is the longest side length to the shortest side length, and hence always has a numerical value of 1 or more. When the aspect ratio of the NN particle is more than 3 in the production of a ceramics using the NN powder, gaps tend to be formed between the particles. Thus, a sufficiently high density cannot be obtained. Thus, $L_{max}/L_{min}$ is preferably 3 or less. In addition, $L_{max}/L_{min}$ is preferably 1.5 or less because gaps in a plate-like NN particle produced using the NN particle can be reduced.

(2) Plate-Like Particle

A plate-like particle of the present invention contains the NN powder and an organic binder, has an aspect ratio of a width to a thickness (width/thickness) of 3 or more, and is (100)-oriented.

The plate-like particle contains at least the NN powder and the organic binder. The organic binder refers to an organic binder that can be used for forming a ceramics into a sheet. Examples of the organic binder include PVB and PVA. The presence of the organic binder allows cuboidal NN particles to bind together to form the plate-like particle.

The plate-like particle has an aspect ratio of a width to a thickness (width/thickness) of 3 or more. When the aspect ratio is 3 or more, the use of the doctor blade method is able to orient the largest face of the plate-like particle to be in parallel to the surface of a carrier film serving as a substrate. When the plate-like article has an aspect ratio of less than 3, the orientation degree of the plate-like particle by the doctor blade method may become lower than that of the case where the aspect ratio is 3 or more.

The plate-like particle is (100)-oriented. That is, the largest face of the plate-like particle is parallel to the (100) plane of NN. When the plate-like particle is (100)-oriented, a green sheet obtained by the doctor blade method is also (100)-oriented. When an NN-containing (100)-oriented ceramics is used as a piezoelectric material, piezoelectric performance can be improved because an engineered domain structure is formed or polarization switching is facilitated.

(3) Method of Manufacturing NN Powder

A method of manufacturing an NN powder according to the present invention includes keeping an aqueous dispersion liquid containing sodium hydroxide and amorphous niobium oxide in an atmosphere at a pressure of more than 0.1 MPa and a temperature of 141 to 250° C. for 1 to 100 hours.

The amorphous niobium oxide refers to niobium oxide in which a broad diffraction specific to an amorphous material is observed but a plurality of sharp diffraction peaks attributed to a crystallized niobium oxide phase are not detected in X-ray diffraction measurement.

The concentration of sodium hydroxide is preferably 2 M or more. When the NN particle is to be synthesized in a process where the concentration of sodium hydroxide is less than 2 M, the resulting particle is indefinite in shape and does not have a cuboid shape. The sodium hydroxide at a concentration of 2 M or more is preferred because the NN particle manufactured by the present invention has a cuboid shape.

The aqueous dispersion liquid refers to a dispersion liquid containing, for example, 51 wt % or more of water as a main component of a dispersion medium and containing a dispersed or partially dissolved solute.

The pressure atmosphere of more than 0.1 MPa is obtained by housing the aqueous dispersion liquid in a sealable container such as an autoclave and heating the container. The internal pressure of the autoclave is a value near the saturated vapor pressure of water at a temperature at which the container is held. The aqueous dispersion liquid is housed in the container so as not to fill the container with the aqueous dispersion liquid. Usually, the volume of the aqueous dispersion liquid is smaller than the volume of the container, and is 80% or less of the volume of the container, for example.

The temperature at which the aqueous dispersion liquid is held is 141 to 260° C. The cuboidal NN particle cannot be obtained at a temperature of 140° C. or less. On the other hand, a temperature of more than 260° C. is not preferred because a Teflon™ container for holding the aqueous dispersion liquid cannot be used.

A time period for holding the aqueous dispersion liquid is 1 to 100 hours. A time period of 1 hour or less is not preferred because a significant variation in particle size occurs, although the cuboidal NN particle can be obtained. A time period of more than 100 hours is not preferred from the industrial standpoint because the production efficiency of the NN particle deteriorates.

The degree of a size variation of the particle in the present invention can be determined from distributions of the average side length of each particle by microscopic observation of the particle. The size variation is determined to be large when the average side length varies in each particle in the range of approximately five times or more, for example, 1 to 15 μm or 3 to 15 μm, and the size variation is determined to be small when the average side length varies in the narrower range than described above. In this regard, however, the size variation is evaluated by the maximum and minimum average side lengths to be observed. Evaluation of the size variation is performed on the size variation of main particles that constitute the powder. For example, the average side length of particles in an amount enough to take statistics is measured, and the size variation is evaluated using the size distribution of main particles that account for 60% of the powder.

The manufacturing method of the present invention limits a powder-manufacturing condition generally called a solvothermal method or a hydrothermal synthesis method.

The niobium oxide used in the manufacturing method of the present invention is desirably amorphous. A raw material for the amorphous niobium oxide is more preferably amorphous niobium oxide hydrate produced by a molten salt method.

The molten salt method is a technique used in synthesis of a single crystal (fine crystal) of an inorganic compound at low temperature, and includes as a procedure performing synthesis in a molten salt using as a solvent a salt that contains as a component a part of elements of an objective compound. A synthesis temperature can be lowered through the use of the molten salt with a low melting point, and the size and form of a crystal to be synthesized can be controlled by control of a temperature-increasing rate, a temperature-decreasing rate, and a reaction temperature.

The niobium oxide hydrate can be produced by the molten salt method using niobium oxide (general formula: $Nb_2O_5$) and potassium carbonate (general formula: $K_2CO_3$). The niobium oxide hydrate is an amorphous hydrate and can be represented by the following general formula (5).

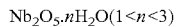

$Nb_2O_5 \cdot nH_2O(1<n<3)$  General formula (5)

In this regard, however, the niobium oxide hydrate may be $Nb_2O_4(OH)_2 \cdot nH_2O$ or $Nb_2O_3(OH)_4 \cdot nH_2O$ as well as $Nb_2O_5 \cdot nH_2O$, or a mixture thereof. In this description, the amorphous niobium oxide hydrate is simply represented by the general formula (5).

The amorphous niobium oxide hydrate reacts with sodium hydroxide to form a cuboidal NN particle. The reaction of niobium oxide other than the amorphous niobium oxide with sodium hydroxide does not form any cuboidal NN particle. Through the use of the amorphous niobium oxide hydrate, there can be provided a sodium niobate powder, including an cuboidal NN particle with an aspect ratio of the longest side to the shortest side of the cuboid of 3 or less, having an NN single phase as a constituent phase evaluated by X-ray diffraction, having a perovskite single-phase structure, having a composition ratio of sodium to niobium (Na/Nb) within $1 \pm 0.1$, and having a small variation in size.

(4) Method of Manufacturing Plate-Like Particle

A method of manufacturing a plate-like particle according to the present invention includes: preparing a slurry containing the NN powder; and forming the slurry into a sheet by a doctor blade method with a gap width of 5 µm or more to 250 µm or less.

The doctor blade method is a method including: preparing a slurry containing a raw material, a solvent, a dispersant, an organic binder, a plasticizer, and the like; and forming a plate-like compact on a carrier film such as PET while the thickness thereof is adjusted with a knife-edge component called a blade. A tape-like ceramics compact obtained by such method is referred to as green sheet. In the present invention, sheet forming using an applicator is also considered as a part of the doctor blade method. Through at least one effect of a shear force generated between the blade and the sheet, a capillary force caused by drying the solvent, a stress during the shrinkage of the green sheet, a pressure at the time of pressure-bonding the green sheet, and the like, the cuboidal NN particle is aligned so that the (100) plane of the cuboidal NN particles in the green sheet will be parallel to the green sheet surface.

The doctor blade method is classified into an aqueous type and an organic solvent type, and any of these types may be employed. Hereinafter, an exemplary method of preparing a slurry of the organic solvent type is described.

The cuboidal NN particle and a solvent having a weight 1.6 to 1.7 times that of the NN particle are added to a container and mixed. At this time, the cuboidal NN particles with different particle size distributions may be mixed. In order not to break the cuboidal NN particle, a stirring deaerator (also referred to as rotation/revolution mixer) can be used for the mixing. The solvent to be used may be a mixed solvent of toluene and ethanol, n-butyl acetate, or the like. After the mixing, a binder and a plasticizer are added. When PVB is used as the binder, the PVB is weighed so that the weight ratio of the solvent to the PVB may be, for example, 88:12. When dibutyl phthalate is used as the plasticizer, the dibutyl phthalate is weighed so that the weight may be equal to that of the binder. Then, the contents are mixed again so as not to break the cuboidal NN particle. The amounts of the solvent and the binder are adjusted so that the viscosity of the slurry may be about 200 to 500 mPa·s.

Through the use of the slurry prepared by such method, a green sheet containing the cuboidal NN particle is produced by the doctor blade method with a gap width of 5 to 250 µm. The gap width refers to a distance between the tip of the blade and the carrier film. When the gap width is less than 5 µm, the resulting green sheet is extremely thin, resulting in difficulty in handling. On the other hand, when the gap width is 250 µm or more, a gap is too wide, with the result that the orientation of the cuboidal NN particle is uncontrollable. Therefore, the gap width is preferably 5 to 250 µm. In this regard, however, when the gap width is smaller than the average side length of the cuboidal NN particle, the NN particle cannot pass under the blade. Therefore, the gap width needs to be larger than the average side length of the NN particle. However, when the gap width is five or more times as large as the average side length of the cuboidal NN particle, the orientation of the cuboidal NN particle is uncontrollable. Therefore, it is preferred that the gap width be 5 to 250 µm and be more than one and five or less times as large as the average side length of the cuboidal NN particle in the slurry. It is preferred that the gap width be two or less times as large as the average side length of the cuboidal NN particle because the orientation degree of the cuboidal NN particle can be additionally enhanced.

The plate-like particle is obtained by cutting and pulverizing the green sheet into a size depending on the purpose. The cuboidal NN particle is bound and held by organic components such as the binder and the plasticizer to form the plate-like particle.

As a matter of course, the plate-like particle can also be produced by any of methods other than the doctor blade method. For example, a slurry containing the cuboidal NN particle is dropped on a smooth glass plate. Then, the slurry is spread out by, for example, slanting the glass plate and formed into a film. The film-like slurry is dried to produce a green sheet. The obtained green sheet may also be pulverized to produce a plate-like particle. Alternatively, the slurry is spin-coated on an appropriate disc. The slurry spread like a film is dried to produce a green sheet. The obtained green sheet may also be pulverized to produce a plate-like particle.

The plate-like particle thus obtained has an aspect ratio of the maximum length in a direction perpendicular to a thickness to the thickness of 3 or more. In addition, the cuboidal NN particle is (100)-oriented.

When the aspect ratio is 3 or more, oriented ceramics can be produced by using the obtained plate-like particle as a host and mixing the host with other guest materials. An aspect ratio of 5 or more is preferred because a ceramics having higher orientation property can be produced.

(5) Method of Manufacturing Oriented Ceramics

One of exemplary embodiments of a method of manufacturing an oriented ceramics according to the present invention includes: filling a mold with a powder containing the plate-like particle: vibrating the mold; pressurizing the powder to produce a compact; and sintering the compact.

In the method of manufacturing an oriented ceramics according to the present invention, the plate-like particle is mixed with a ram material powder to react with NN, such as barium titanate, potassium niobate, bismuth ferrate (general formula: $BiFeO_3$), or bismuth sodium titanate (general formula: $(Bi_{0.5}Na_{0.5})TiO_3$), and the mixture is placed in a mold. The mold to be used may be a metallic dice generally used in uniaxial pressing. Then, a tapping treatment including vibrating the mold to fluidize the particle is performed. The vibration may be applied using a machine or may be applied by repeating movements of lifting the mold up with a hand and placing it on a base. The strength of the vibration is preferably one which is enough to fluidize the particle in the mold and allows slight vibration of the particle to be visually observed.

The mold filled with the powder is pressurized to produce a compact. For example, a compact can be formed by applying a uniaxial pressure of 50 to 200 MPa to the mold. In addition, a compact may be produced by producing a preliminary compact by applying a uniaxial pressure of about 50 MPa to the mold, vacuum-packing the preliminary compact, and applying an isotropic pressure to the preliminary compact in a liquid such as water or oil. Although the uniaxial pressing is simple and easy, the use of the isotropic pressure can further reduce uneven distortion in the compact. The obtained compact is sintered to produce a (100)-oriented perovskite-type oriented ceramics. The sintering is usually performed in an air atmosphere. The sintering temperature varies depending on the kind of the material and falls within the range of 900 to 1,500° C. The sintering time period is preferably about 1 to 6 hours. A temperature profile of a furnace with respect to the time period in a sintering process can be arbitrarily adjusted for the purpose of increasing the degree of orientation and the density of a sintered product. For example, for the purpose of increasing the degree of orientation, the temperature-increasing rate of only a certain temperature section may be made smaller than that of the other sections. A profile in which the sintering temperature is temporally made higher can be used for the purpose of increasing the density of a sintered product.

One of exemplary embodiments of the method of manufacturing an oriented ceramics according to the present invention includes: heating the plate-like particle to produce a plate-like particle free of an organic binder; forming a slurry into a sheet to produce green sheets; laminating the green sheets to produce a laminate; and sintering the laminate.

When the slurry containing the plate-like particle is synthesized for the purpose of using it in the doctor blade method, the process is restricted because a solvent does not cause the elution of the organic binder from the plate-like particle needs to be used. Therefore, if needed, calcination is performed to evaporate the organic binder, thereby producing a plate-like inorganic particle. Thus, the degree of freedom of the process can be increased.

The plate-like particle is calcined in air at 900 to 1,200° C. to produce a plate-like inorganic particle free of any organic binder component. In the present invention, the phrase "free of an organic binder" means that the content of the organic binder is less than 0.5 wt %.

A slurry containing the obtained plate-like inorganic particle is prepared by a method described below.

To a container, the plate-like inorganic particle and optionally a powder other than the plate-like inorganic particle (for example, an NN particle prepared by a solid state reaction, or a powder of barium titanate, potassium niobate, bismuth ferrate, bismuth sodium titanate, or the like) are added and mixed together to prepare a raw material powder. A solvent having a weight 1.6 to 1.7 times that of the raw material powder is added and mixed. The solvent to be used may be, for example, a mixed solvent of toluene and ethanol, or n-butyl acetate. A stirring deaerator can be used for mixing so that the plate-like inorganic particle may not be destroyed. After the mixing, a binder and a plasticizer are added. In the case of using PVB as the binder, it is weighed so that the weight ratio of the solvent to the PVB may be 88:12. In the case of using dibutyl phthalate as the plasticizer, it is weighed so as to be equal to the weight of the binder. Then, mixing is performed again so that the plate-like inorganic particle may be prevented from being broken. The amounts of the solvent and binder are adjusted so that the viscosity of the resulting slurry may be approximately 200 to 500 mPa·s. Sheet forming is performed using the slurry thus obtained. The doctor blade method can be used for the sheet forming.

The resulting green sheets can be bonded by thermal compression until a desired thickness is achieved. The green sheets can be laminated one on top of another by laminating 10 to 100 green sheets and then subjecting them to, for example, a pressure of about 10 to 30 MPa at 50 to 90° C. for 10 seconds to 10 minutes in the lamination direction. A paste containing components such as Ag, Pd, Pt, and Ni may be printed between the layers of the green sheets in advance and used as an internal electrode.

The obtained green sheet or the green-sheet laminate is cut into a desired shape and then sintered to obtain a (100)-oriented perovskite-type oriented ceramics. Sintering is usually performed in air atmosphere. Sintering temperature is in the range of 900 to 1,500° C. depending on the kind of the material. The sintering time period is preferably about 1 to 6 hours. A sintering temperature profile with respect to the time period in a sintering process can be arbitrarily adjusted for the purpose of increasing the degree of orientation and the density of a sintered product. For example, for increasing the degree of orientation, the temperature-increasing rate of only a certain temperature section may be smaller than that of the other sections. Further, a profile in which the sintering temperature is temporally increased can also be used for the purpose of increasing the density of a sintered product.

One of exemplary embodiments of the method of manufacturing an oriented ceramics according to the present invention includes: forming a slurry containing the cuboidal NN powder into sheets to obtain green sheets; laminating the green sheets to form a laminate; and sintering the laminate.

Hereinafter, a method of preparing an organic solvent-based slurry is exemplified.

To a container, the cuboidal NN particle and optionally another powder (for example, an NN particle prepared by a solid state reaction, or a powder of barium titanate, potassium niobate, bismuth ferrate, bismuth sodium titanate, or the like) are added and mixed together to prepare a raw material powder. A solvent having a weight 1.6 to 1.7 times that of the raw material powder is added to the container and mixed with the raw powder. A stirring deaerator can be used for mixing so that the cuboidal NN particle may not be destroyed. The solvent to be used may be a mixed solvent of toluene and ethanol, or n-butyl acetate. After the mixing, a binder and a plasticizer are added. In the case of using PVB as the binder, it is weighed so that the weight ratio of the solvent to the PVB may be 88:12. In the case of using dibutyl phthalate as the plasticizer, it is weighed so as to be equal to the weight of the binder. Then, mixing is performed again so that the cuboidal NN particle may be prevented from being broken. The amounts of the solvent and binder are adjusted so that the viscosity of the resulting slurry may be approximately 200 to 500 mPa·s.

Sheet forming is performed using the slurry thus obtained. The doctor blade method can be used for the sheet forming.

The resulting green sheets can be bonded by thermal compression until a desired thickness is achieved. The green sheets can be laminated one on top of another by laminating 10 to 100 green sheets and then subjecting them to, for example, a pressure of 10 to 30 MPa at 50 to 90° C. for 10 seconds to 10 minutes in the lamination direction. A paste containing components such as Ag, Pd, Pt, and Ni may be printed between the layers of the green sheets in advance and used as an internal electrode.

Thermal compression bonding may be performed after laminating 10 to 100 layers as described above. However, it is preferred that the thermal compression bonding is repeated every small number of layers because the cuboidal particle is oriented by pressure.

The obtained green sheet or the green-sheet laminate is cut into a desired shape and then sintered to obtain a (100)-oriented perovskite-type oriented ceramics. The sintering is usually performed in an air atmosphere. The sintering temperature is in the range of 900 to 1,500° C. depending on the kind of the material. The sintering time period is preferably about 1 to 6 hours. A temperature profile with respect to a time change in a sintering process can be arbitrarily adjusted for the purpose of increasing the degree of orientation and the density of a sintered product. For example, for increasing the degree of orientation, the temperature-increasing rate of only a certain temperature section may be smaller than that of the other sections. Further, a profile in which the sintering temperature is temporally increased can also be used for the purpose of increasing the density of a sintered product.

One of exemplary embodiments of the method of manufacturing an oriented ceramics according to the present invention includes: mounting a metal oxide powder containing a cuboidal metal oxide particle having an average side length of 1 μm or more to 1,000 μm or less on a substrate; vibrating the substrate; producing a compact from the powder; and sintering the compact.

The cuboidal metal oxide particle particularly contain the cuboidal NN particle, and a cuboidal bismuth sodium titanate, bismuth ferrate, or barium titanate particle having a (100) plane as at least one face thereof like the cuboidal NN particle. The metal oxide powder contains, in addition to cuboidal metal oxide particle, a non-cuboidal metal oxide particle, and a carbonate powder of barium carbonate or sodium carbonate.

The cuboidal metal oxide particle desirably has an average side length of 1 μm or more to 100 μm or less. An average side length of less than 1 μm is not preferred because the particle is not oriented by the subsequent vibration. On the other hand, an average side length of more than 100 μm is not preferred because of difficulty in attaining a sufficiently high sintered density and enlargement of a composition distribution.

The substrate is provided for holding the metal oxide powder and has a smooth surface. The smooth surface is a uniformly flat surface without any irregularity larger than the cuboidal particle to be used. A mold for uniaxial press forming or a carrier film for sheet forming can also be used.

Vibration is applied to the substrate. Vibration is performed for the purpose of flowing the particle. The vibration may be applied using a machine or may be applied by repeating movements of lifting the mold up with a hand and placing on a substrate. The vibration is desirably strong enough to move the particle in the mold and allow a slight movement of the particle to be visually observed.

The mold filled up with the powder is pressurized to make a compact. For example, the compact can be formed by applying a uniaxial pressure of, for example, 50 to 200 MPa to the mold. Alternatively, the compact may be prepared by forming a preliminary compact by applying a uniaxial pressure of about 50 MPa to the mold, vacuum-packing the preliminary compact, and applying an isotropic pressure to the preliminary compact in a liquid such as water or oil. Although the uniaxial pressing is simple and easy, the use of an isotropic pressure can reduce an uneven distortion in the compact. In order to increase the strength of the compact, before pressure forming, water, an alcohol, and an organic binder may be included in the metal oxide powder.

By sintering the obtained compact, a (100)-oriented perovskite-type oriented ceramics can be obtained. Sintering is usually performed in air atmosphere. Sintering temperature is in the range of 900 to 1,500° C. depending on the kind of the material. The sintering time period is preferably about 1 to 6 hours. A temperature profile with respect to a time change at the time of sintering can be arbitrarily adjusted for the purpose of increasing the degree of orientation and the density of a sintered body. For example, for increasing the degree of orientation, the temperature-increasing rate of only a certain temperature section may be smaller than that of the other sections. Further, a profile in which the sintering temperature is temporally increased can also be used for the purpose of increasing the density of a sintered body.

The oriented ceramics of the present invention is a polycrystalline body consist of fine polycrystalline particles or single crystal particles, but not a so-called single crystal having macroscopically a three-dimensional crystal orientation. Crystals in the oriented ceramics have crystal axes being oriented along a certain axis, and no crystal orientation is present in the direction perpendicular to the axis.

Hereinafter, the piezoelectric material of the present invention is described in more detail with reference to examples. However, the present invention is not limited to the following examples. Hereinafter, hydrates are described as examples of amorphous niobium oxide. However, the amorphous niobium oxide of the present invention is not limited to the hydrates. Hereinafter, examples and comparative examples of the sodium niobate powder of the present invention are described, respectively. Further, in Table 1, niobium raw materials used, the concentration of an aqueous sodium hydroxide solution, a reaction temperature and a reaction time in a hydrothermal synthesis, a constituent phase of an obtained particle, a particle shape, a particle size distribution, the average side length estimated by electron microscopic observation.

EXAMPLES 1 to 5

A powder mixture was prepared by mixing 10 g of $Nb_2O_5$ (manufactured by Kanto Chemical Co., Inc.) and 52 g of $K_2CO_3$ (manufactured by Kanto Chemical Co., Inc.). Using a platinum crucible, the powder mixture was kept at 950° C. for 1 hour in the air to melt the powder mixture. The crucible was quenched after 1 hour. The obtained white mass was dissolved in 500 ml of water. Then, insoluble matter was removed through 7-micron coarse filter paper. To the sample from which the insoluble matter had been removed, 200 ml of $HNO_3$ (manufactured by Kanto Chemical Co., Inc.) and 300 ml of water were gradually added. A white powder was precipitated. The precipitate was collected on filter paper and washed with water. The collected product was dried at 50° C.

The sample obtained by this method was amorphous niobium oxide hydrate described in the following general formula (5).

$$Nb_2O_5 \cdot nH_2O (1<n<3) \quad \text{General formula (5)}$$

The sample was evaluated by X-ray diffraction, and no diffraction peak due to niobium oxide was detected. In addition, the sample was heated and n in the general formula (5) was determined from a variation in weight. The resulting average n value was 1.5.

Next, the obtained niobium oxide hydrate was used as a raw material, and an NN powder was synthesized under the conditions described in Table 1.

One gram of niobium oxide hydrate and 50 ml of an aqueous sodium hydroxide solution at a concentration of 2 to 4 M were placed in a 70-ml volume autoclave having a jacket made of Teflon™ therein. The autoclave was sealed and kept at 180 to 200° C. for 24 to 96 hours and then slowly cooled to room temperature. While being kept at high temperature, the inner pressure of the autoclave reached 0.1 MPa or more. The contents taken out of the autoclave were filtered to take out a product. The obtained sample was washed with distilled water and then dried at 50° C. The constituent phase of the obtained sample was determined by X-ray diffraction, the shape and average side length thereof were determined by a scanning electron microscope, and the composition thereof was determined by ICP.

The X-ray diffraction revealed that the obtained particle was of an orthorhombic NN single phase and the structure thereof was a perovskite single-phase structure. The microscopic observation revealed that the particle was of a cuboid shape where the angle between a certain face and a face adjacent thereto was within 90°±10°. Variations in average side length of the observed major particles are not more than three times, resulting in small particle size distribution. When the shortest side length of the cuboidal particle was defined as $L_{min}$ and the longest side length thereof was defined as $L_{max}$, any of the cuboidal particle had a ratio $L_{max}/L_{min}$ of 1.5 or less.

The ICP analysis revealed that the Na/Nb mole ratio of the NN powder prepared in the present invention was more than 1 and less than 1.05. The Na/Nb ratio was 1.03 on average.

COMPARATIVE EXAMPLES 1 and 3

Samples were each prepared under the same conditions as in Example 2 except that the concentration of sodium hydroxide was changed to 0.5 M, which was defined as Comparative Example 1, or that the reaction temperature was changed to 140° C., which was defined as Comparative Example 3. The samples were prepared under the above-mentioned conditions, and the obtained powders were not NN.

COMPARATIVE EXAMPLES 2 and 4

Samples were each prepared under the same conditions as in Example 2 except that the concentration of sodium hydroxide was changed to 1 M, which was defined as Comparative Example 2, or that the reaction temperature was changed to 160° C., which was defined as Comparative Example 4. The samples were prepared under the above-mentioned conditions, and the obtained powders in both Comparative Examples 2 and 4 were each a mixture of an amorphous NN particle and a cuboidal NN particle. Further, the average side length of the cuboidal NN particle was widely distributed in the range of 1 μm to 15 μm. In addition, as compared to the NN particle prepared under the conditions of sodium hydroxide at a concentration of 2 M or more or of a reaction temperature of 180° C. or more (Examples 1 to 5), the NN particle prepared using sodium hydroxide at a concentration of 1 M or less or at a reaction temperature of 160° C. or less showed low intensity in the X-ray diffraction pattern and low crystallinity.

COMPARATIVE EXAMPLES 5 to 7

Samples were prepared under the same conditions as in Example 2 except that the niobium raw material was changed to $Nb_2O_5$, $HNbO_3 \cdot nH_2O$, and $HNb_3O_8 \cdot nH_2O$, which were defined as Comparative Examples 5, 6, and 7, respectively. In each of cases, the constituent phase of the obtained powder was NN, but the particle shape thereof was not cuboid.

COMPARATIVE EXAMPLE 8

As a raw material powder for an NN particle, $Na_2CO_3$ and $Nb_2O_5$ were weighed so as to be Na:Nb=1:1 to prepare a powder mixture. A powder containing an NN particle was prepared by the solid state reaction including sintering the powder mixture at 1,000° C. The prepared NN particle was not cuboidal but amorphous.

COMPARATIVE EXAMPLE 9

The NN particle prepared in Comparative Example 8 and a commercially available barium titanate particle (BT01 manufactured by Sakai Chemical Industry Co., Ltd.) were mixed so as to have a mole ratio of NN:BaTiO₃=88:12 to obtain powder. Then, the obtained powder was used to prepare a ceramics through sintering at 1,260° C. for 5 hours. The obtained ceramics was a polycrystalline body and unoriented.

The results of Examples 1 to 5 and Comparative Examples 1 to 7 are summarized in Table 1.

TABLE 1

| | Raw material | NaOH concentration (M) | Reaction temperature (° C.) | Reaction time (Hours) | Constituent phase | Particle shape | Particle size distribution | Average side length (micron(s)) |
|---|---|---|---|---|---|---|---|---|
| Comparative Example 1 | $Nb_2O_5 \cdot nH_2O$ | 0.5 | 180 | 24 | $Na_7(H_3O)Nb_6O_{19} \cdot 14H_2O$ | Amorphous | — | — |
| Comparative Example 2 | $Nb_2O_5 \cdot nH_2O$ | 1 | 180 | 24 | $NaNbO_3$ | Amorphous + Cuboidal | Large | 1 to 15 |
| Example 1 | $Nb_2O_5 \cdot nH_2O$ | 2 | 180 | 24 | $NaNbO_3$ | Cuboidal | Small | 5 to 10 |
| Example 2 | $Nb_2O_5 \cdot nH_2O$ | 4 | 180 | 24 | $NaNbO_3$ | Cuboidal | Small | 5 to 10 |
| Comparative Example 3 | $Nb_2O_5 \cdot nH_2O$ | 4 | 140 | 24 | $Na_7(H_3O)Nb_6O_{19} \cdot 14H_2O$ | Amorphous | — | — |
| Comparative Example 4 | $Nb_2O_5 \cdot nH_2O$ | 4 | 160 | 24 | $NaNbO_3$ | Amorphous + Cuboidal | Large | 3 to 15 |
| Example 3 | $Nb_2O_5 \cdot nH_2O$ | 4 | 200 | 24 | $NaNbO_3$ | Cuboidal | Small | 5 to 10 |

TABLE 1-continued

| | Raw material | NaOH concentration (M) | Reaction temperature (° C.) | Reaction time (Hours) | Constituent phase | Particle shape | Particle size distribution | Average side length (micron(s)) |
|---|---|---|---|---|---|---|---|---|
| Example 4 | $Nb_2O_5 \cdot nH_2O$ | 4 | 180 | 48 | $NaNbO_3$ | Cuboidal | Small | 10 to 15 |
| Example 5 | $Nb_2O_5 \cdot nH_2O$ | 4 | 180 | 96 | $NaNbO_3$ | Cuboidal | Small | 10 to 20 |
| Comparative Example 5 | $Nb_2O_5$ | 4 | 180 | 24 | $NaNbO_3$ | Amorphous | — | — |
| Comparative Example 6 | $HNbO_3 \cdot nH_2O$ | 4 | 180 | 24 | $NaNbO_3$ | Amorphous | — | — |
| Comparative Example 7 | $HNb_3O_8 \cdot nH_2O$ | 4 | 180 | 24 | $NaNbO_3$ | Amorphous | — | — |

Figure 2A:
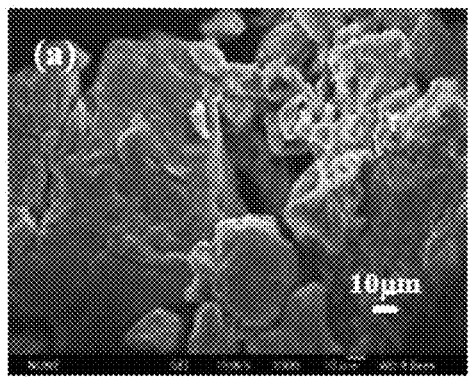
FIGS. 2A, 2B, 2C, and 2D show scanning electron microscope photographs of powders obtained by hydrothermal synthesis including using as raw materials $Nb_2O_5 \cdot nH_2O$ and aqueous NaOH solutions at concentrations shown below and keeping the raw materials at 180° C. for 24 hours.
Figure 2B:
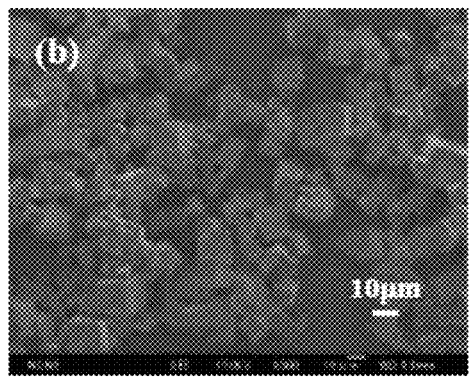
Figure 2C:
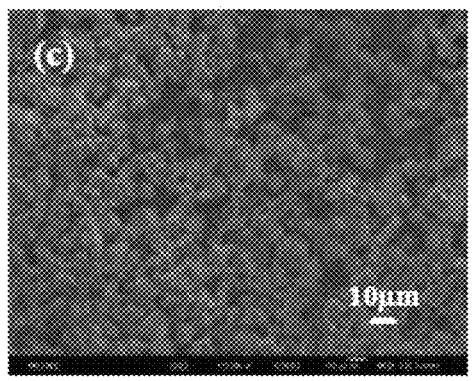
Figure 2D:
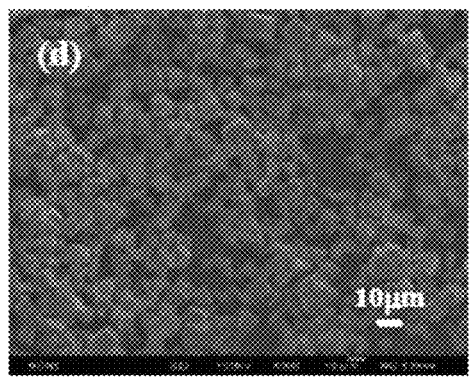
Figure 3:
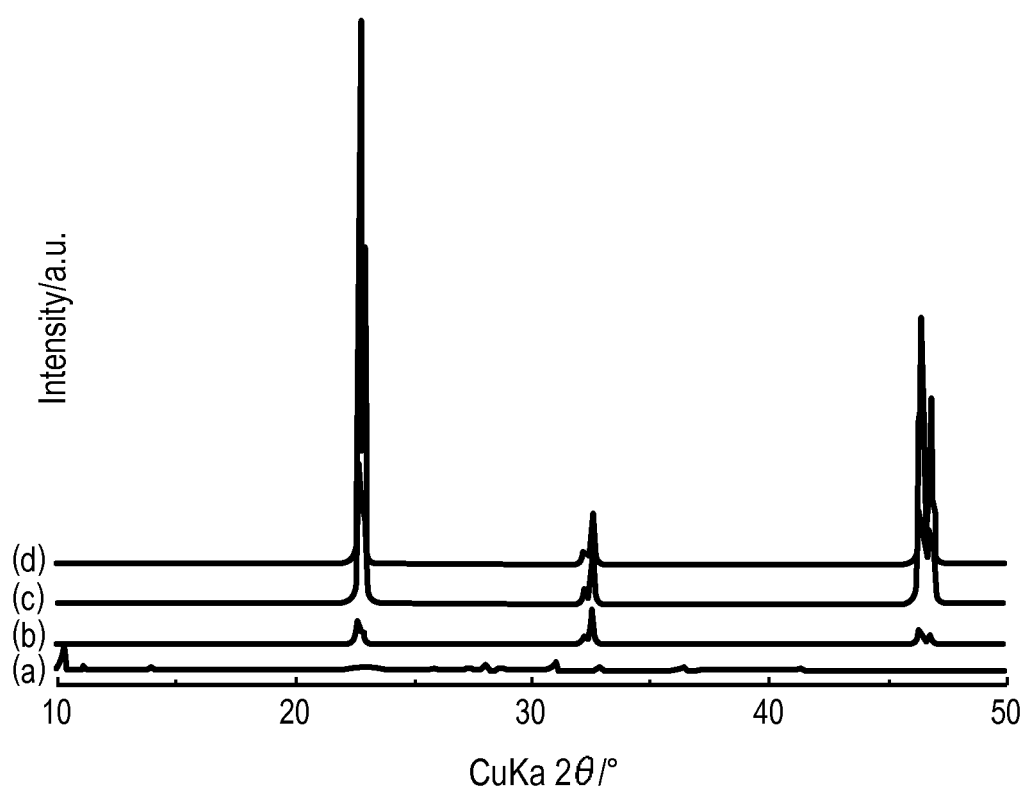
FIG. 3 shows X-ray diffraction patterns of powders obtained by hydrothermal synthesis including using as raw materials $Nb_2O_5 \cdot nH_2O$ and a 4.0 M aqueous NaOH solution and keeping the raw materials at temperatures shown below for 24 hours. In the figure, (a) shows data at 140° C. (Comparative Example 3), (b) shows data at 160° C. (Comparative Example 4), (c) shows data at 180° C. (Example 2), and (d) shows data at 200° C. (Example 3).
Figures 7A, 7B, 7C:
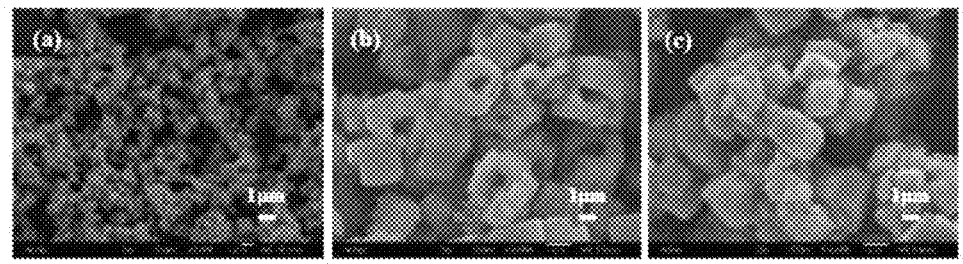
FIGS. 7A, 7B, and 7C show scanning electron microscope photographs of powders obtained by hydrothermal synthesis including using as raw materials niobium raw materials shown below and a 4.0 M aqueous NaOH solution and keeping the raw materials at 180° C. for 24 hours.

FIGS. 2A to 2D show scanning electron microscope photographs of the powders each obtained by hydrothermal synthesis including using $Nb_2O_5 \cdot nH_2O$ and aqueous NaOH solutions having concentrations shown below as raw materials and keeping the raw materials at 180° C. for 24 hours. FIG. 2A is a photograph at 0.5 M (Comparative Example 1), FIG. 2B is a photograph at 1.0 M (Comparative Example 2), FIG. 2C is a photograph at 2.0 M (Example 1), and FIG. 2D is a photograph at 4.0 M (Example 2). It is seen that, as compared to FIGS. 2A and 2B, particles shown in FIGS. 2C and 2D corresponding to the examples of the present invention are less variable in particle shape and have a small particle size distribution.

FIGS. 4A to 4D show scanning electron microscope photographs of powders each obtained by hydrothermal synthesis including using $Nb_2O_5 \cdot nH_2O$ and a 4.0 M aqueous NaOH solution as raw materials and keeping the raw materials at temperatures shown below for 24 hours. FIG. 4A is a photograph in the case of keeping the raw materials at 140° C. (Comparative Example 3), FIG. 4B is a photograph in the case of keeping the raw materials at 160° C. (Comparative Example 4), FIG. 4C is a photograph in the case of keeping the raw materials at 180° C. (Example 2), and FIG. 4D is a photograph in the case of keeping the raw materials at 200° C. (Example 3). It is seen that, as compared to FIGS. 4A and 4B, imply that particles shown in FIGS. 4C and 4D corresponding to the examples of the present invention are less variable in particle shape and have a small particle size distribution.

FIGS. 5A and 5B show scanning electron microscope photographs of powders each obtained by hydrothermal synthesis including using $Nb_2O_5 \cdot nH_2O$ and an 4.0 M aqueous NaOH solution as raw materials and keeping the raw materials at 180° C. for time periods shown below. FIG. 5A is a photograph in the case of keeping the raw materials for 48 hours (Example 4) and FIG. 5B is a photograph in the case of keeping the raw materials for 96 hours (Example 5). It is well understood that high-quality particles that are less variable in particle shape and show a small particle size distribution are obtained.

As understood from Table 1, FIGS. 2A to 2D, FIGS. 4A to 4D, and FIGS. 5A and 5B mentioned above, amorphous niobium oxide found out by the inventors of the present invention, an aqueous sodium hydroxide solution with a concentration of 2 M or more, and a reaction temperature of 180° C. or more are required to obtain a dispersed, cuboidal, single-phased NN particle with a small particle size distribution.

EXAMPLE 6

An NN powder containing a cuboidal NN particle having an average side length of 5 to 20 μm was prepared according to the method described in Examples 1 to 5. Then, a plate-like NN particle was prepared by the doctor blade method using the prepared NN powder.

To a container, the prepared NN particle and a solvent having a weight 1.6 to 1.7 times that of the NN particle were added. The solvent used was a mixed solvent of toluene and ethanol. The weight ratio of toluene to ethanol was set to 53:47. The resulting slurry was mixed with a stirring deaerator. Subsequently, a binder and a plasticizer were added. The binder used was PVB (BH-3 manufactured by Sekisui Chemical Co., Ltd.). The weight of the PVB was set to 0.07 times the weight of the particle in the slurry. As the plasticizer, dibutyl phthalate in the same amount as that of the binder was added. Then, mixing was performed by the stirring deaerator again. The amounts of the solvent and binder were adjusted to set the viscosity of the slurry to approximately 200 to 500 mPa·s, and vacuum deaeration was then performed.

A green sheet containing a cuboidal NN particle was formed using the obtained slurry and a doctor blade device. After the sheet forming, the green sheet was dried overnight. Then, the green sheet was evaluated by X-ray diffraction and a scanning electron microscope. When the gap width was five times or more the size of the cuboidal NN particle, a Lotgering factor representing the degree of (100) orientation was approximately 0%, and the NN particle was not oriented to any extent. A Lotgering factor representing the degree of (100) orientation was more than 0% and less than 20% in the case where the gap width was more than two times and less than five times the average side length of the cuboidal NN particle, and the Lotgering factor was 20% or more in the case where the gap wide was one or more times and two or less times the average length. In other words, when the gap width was two or less times the average side length of the cuboidal NN particle, the NN particle was (100)-oriented with a high degree of orientation. The green sheet was pulverized and passed through a sieve (for example, a mesh size of 75 microns) to obtain a plate-like particle. The plate-like NN particle was prepared such that the thickness of the plate-like NN particle was 1 to 3 times that of the cuboidal NN particle and an aspect ratio (width/thickness) between the thickness and the largest width perpendicular to the thickness was 3 or more.

EXAMPLE 7

Powder containing a cuboidal NN particle having an average side length of 5 to 20 μm was prepared, and a plate-like NN particle was prepared. In ethanol containing PVB (BL-1 manufactured by Sekisui Chemical Co., Ltd.) at a concentration of 4.5 wt %, the cuboidal NN particle was dispersed. The solution was dropped on a glass plate, and the glass plate was slanted to spread out the cuboidal NN particle on the glass substrate. After spreading the cuboidal NN particle, the glass plate was returned to horizontal and left standing. A film containing the cuboidal NN particle was obtained after evaporation of the alcohol. The film containing the cuboidal NN particle was stripped from the glass plate, and the crystal orientation thereof was evaluated by X-ray diffraction. The film containing the NN particle was pulverized and passed through a sieve to obtain a desired plate-like NN particle. The thickness of the plate-like NN particle was 1 to 5 times that of the cuboidal NN particle, and an aspect ratio (width/thickness) between the thickness and the largest width perpendicular to the thickness was 3 or more.

Figure 8:
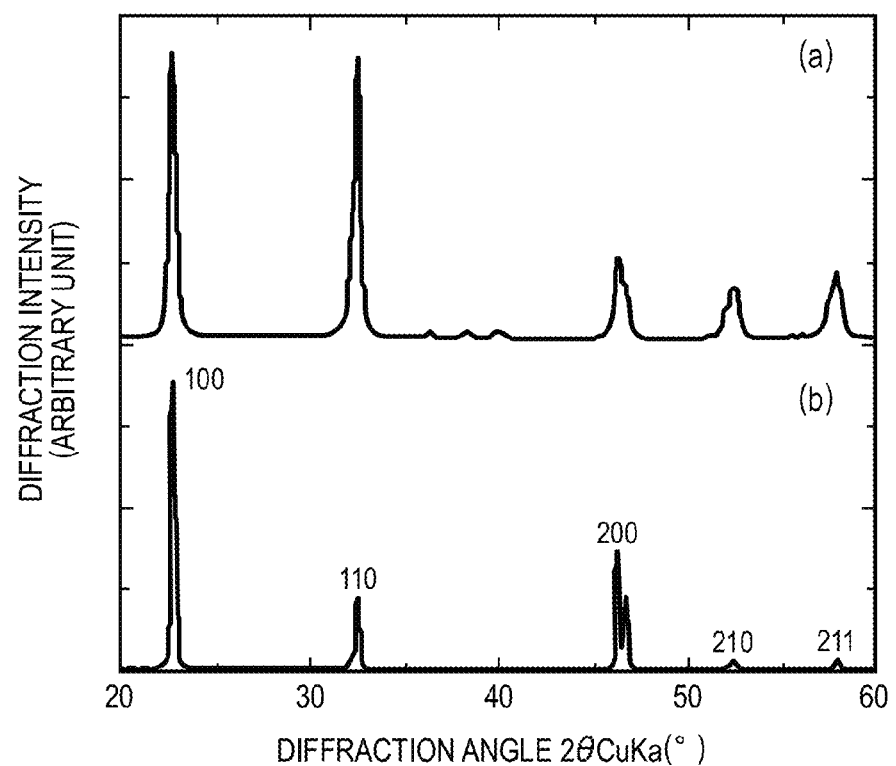
In FIG. 8, (a) shows an X-ray diffraction pattern of an $NaNbO_3$ powder produced by a solid state reaction using as raw materials $Nb_2O_5$ and $Na_2CO_3$ (Comparative Example 7), and (b) shows an X-ray diffraction pattern of a plate-like particle produced using a cuboidal $NaNbO_3$ powder prepared by the hydrothermal synthesis of the present invention (Example 7).

FIG. 8 shows X-ray diffraction patterns of the plate-like particle. It is shown that, as compared to the X-ray diffraction patterns of the NN particle prepared by the solid state reaction in Comparative Example 7, the diffraction patterns of the plate-like particle prepared in this example has high diffraction intensities at 100 and 200, representing (100) orientation. The (100) orientation results from the fact that a certain face of the cuboidal NN particle was brought into contact with the surface of the smooth glass plate.

EXAMPLE 8

A powder mixture was prepared by mixing the plate-like NN particle prepared in Example 6 or 7 with barium titanate particle (BT01 manufactured by Sakai Chemical Industry Co., Ltd.) having a particle size of 100 nm. A molar fraction of the plate-like NN particle to the barium titanate particle was set to 88:12. A press-forming mold was filled with the powder mixture. During the filling, the press-forming mold was tapped with a hand, or subjected to vibration with a small vibrator (Vibratory Packer VP type, manufactured by Sinfonia Technology Co., Ltd.). Subsequently, uniaxial pressing at 200 MPa was performed on the powder mixture to prepare a disc-shaped compact of 10 mm in diameter and 1 to 2 mm in thickness. The compact was held at 600° C. for 3 hours in the air to remove the binder, and continuously heated up to 1,260° C. and held for 6 hours to obtain a sintered product. The sintered product was ground, and the constituent phase and crystal orientation of the sintered product were evaluated by X-ray diffraction. It was found that the obtained sample was of a single phase of a solid solution of NN and barium titanate, and (100)-oriented.

Figure 9:
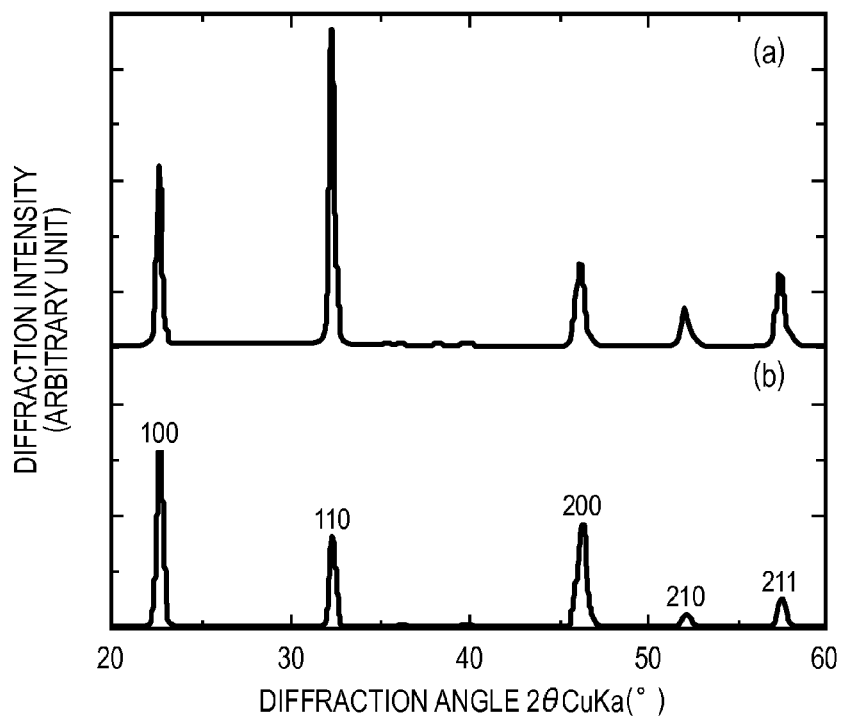
FIG. 9 shows X-ray diffraction patterns of a $0.88NaNbO_3$-$0.12BaTiO_3$ ceramics sintered at 1,260° C. In the figure, (a) shows data of an unoriented ceramics produced using $NaNbO_3$ produced by a solid state reaction and $BaTiO_3$ (manufactured by Sakai Chemical Industry Co., Ltd.) produced by hydrothermal synthesis (Comparative Example 9), and (b) shows data of a (100)-oriented ceramics produced using as raw materials the plate-like particle of the present invention and $BaTiO_3$ (manufactured by Sakai Chemical Industry Co., Ltd.) produced by hydrothermal synthesis (Example 8).

FIG. 9 shows X-ray diffraction patterns of the oriented ceramics prepared using the plate-like NN particle. It is shown that, as compared to the X-ray diffraction patterns of the unoriented ceramics prepared by the solid state reaction in Comparative Example 8, the diffraction patterns of the plate-like particle prepared in this example has high diffraction intensities at 100 and 200, representing (100) orientation.

EXAMPLE 9

Potassium carbonate $KCO_3$ and niobium oxide $Nb_2O_5$ were mixed, and sintered at 900° C. in the air to prepare a potassium niobate particle. A powder mixture was prepared by mixing the plate-like NN particle prepared in Example 6 or 7 with potassium niobate particle prepared by the solid state reaction. A molar fraction of NN to potassium niobate was set to 50:50. A press-forming mold was filled with the powder mixture. During the filling, the press-forming mold was tapped with a hand, or subjected to vibration with a small vibrator (for example, Vibratory Packer VP type, manufactured by Sinfonia Technology Co., Ltd.). Subsequently, uniaxial pressing at 200 MPa was performed on the powder mixture to prepare a disc-shaped compact of 10 mm in diameter and 1 to 2 mm in thickness. The compact was held at 600° C. for 3 hours in the air to remove the binder, and continuously heated up to 1,000° C. and held for 6 hours to obtain a sintered product. The sintered product was ground, and the constituent phase and crystal orientation of the sintered product were evaluated by X-ray diffraction. It was found that the obtained sample was of a single phase of sodium potassium niobate, and (100)-oriented.

Figure 10:
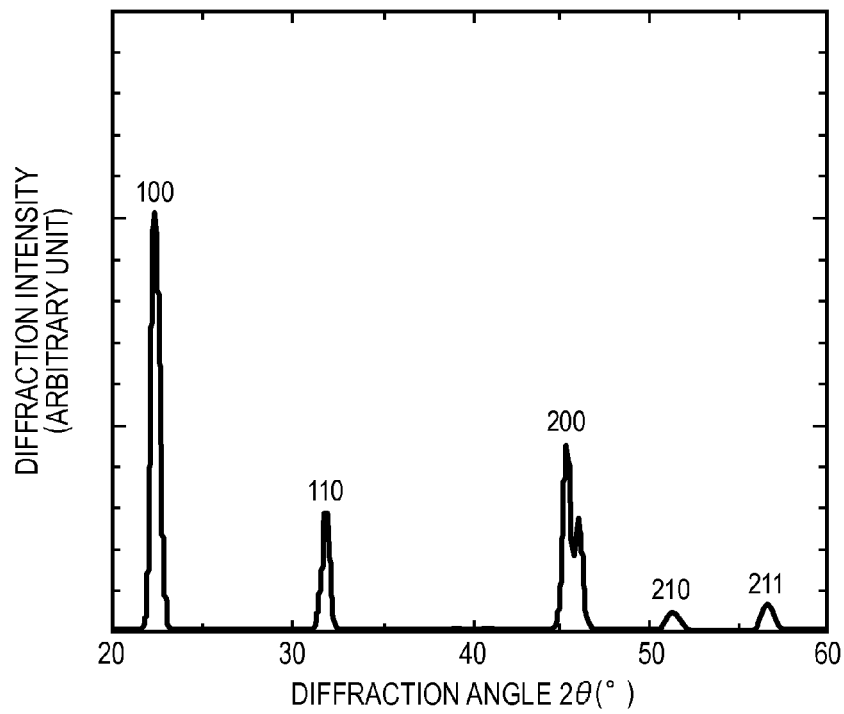
FIG. 10 shows an X-ray diffraction pattern of a (100)-oriented $0.5KNbO_3$-$0.5NaNbO_3$ ceramics sintered at 1,000° C. using as raw materials $KNbO_3$ produced by a solid state reaction and the plate-like particle of the present invention (Example 9).

FIG. 10 shows X-ray diffraction patterns of the sodium potassium niobate oriented ceramics prepared using the plate-like NN particle. It is shown that, as compared to the X-ray diffraction pattern of the NN unoriented ceramics prepared by the solid state reaction in Comparative Example 8 ((a) in FIG. 8), the diffraction patterns of the oriented ceramics prepared in this example have high diffraction intensities at 100 and 200, representing (100) orientation.

EXAMPLE 10

The plate-like NN particle prepared in Example 6 or 7 was sintered at 900 to 1,200° C. Sintering caused a decrease in weight corresponding to the amount of the binder included in the raw materials and allowed the cuboidal NN particles to react with one another at a grain boundary to provide a plate-like inorganic NN particle. A powder mixture was prepared by mixing the obtained plate-like inorganic NN particle and an amorphous NN particle (200 to 1,500 nm in particle size) prepared by the solid state reaction, and a barium titanate particle (BT01 manufactured by manufactured by Sakai Chemical Industry Co., Ltd.). A molar fraction of NN to barium titanate was set to 88:12. The plate-like NN particle was used for 20 to 50% of NN. Using the mixture powder as a raw material, a green sheet was prepared by the doctor blade method described in Example 6. The gap was set to 1 to 3 times the average longest side length of the plate-like NN particle used. The green sheet was dried overnight, and a plurality of the green sheets was then laminated and bonded by thermal compression under a pressure of 30 MPa at 85° C. The thermal compression bonded green sheets were cut into appropriate sizes with a cutter knife. Subsequently, first, the cut sheets were kept at 600° C. to remove the binder, and then sintered at 1,260° C. for 6 hours. The obtained ceramics was a solid solution of (100)-oriented NN and barium titanate.

EXAMPLE 11

In Example 10, the green sheet containing the plate-like NN particle, amorphous NN particle, and barium titanate was prepared and then bonded by thermal compression so as to have a thickness of 100 to 200 microns. Subsequently, an electrode layer was formed on the compression bonded green sheet. The electrode layer was a paste of Ag and Pd (Ag:Pd=7:3) and formed on the green sheet by a screen printing method. After drying the sample, the green sheets were laminated one on top of another so as to be —/green sheet/electrode/green sheet/—. The laminated green sheets were bonded by thermal compression under a pressure of 30 MPa at 85° C. The thermal compression bonded green sheets were cut into appropriate size pieces, and sintered at 1,150° C. The obtained laminated ceramics was a solid solution of (100)-oriented NN and barium titanate.

EXAMPLE 12

A powder mixture was prepared by mixing the cuboidal NN particle prepared in each of Examples 1 to 5, an amorphous NN particle prepared by the solid state reaction or the like, and a barium titanate particle (BT01 manufactured by Sakai Chemical Industry Co., Ltd.). A molar fraction of NN to barium titanate was set to 88:12. The cuboidal NN particle was used for 20 to 80% of NN. Using the mixture powder as a raw material, a green sheet was prepared by the doctor blade method described in Example 6. The gap of the doctor blade was set to two times the average side length of the cuboidal NN particle. The green sheet was dried overnight, and a plurality of the green sheets was then laminated and bonded by thermal compression under a pressure of 30 MPa at 85° C. The thermal compression bonded green sheets were cut into appropriate size pieces, and sintered. First, the cut sheets were kept at 600° C. to remove the binder, and then sintered at 1,260° C. for 6 hours. The obtained ceramics was a solid solution of (100)-oriented NN and barium titanate.

EXAMPLE 13

In Example 12, the green sheet containing the cuboidal NN particle, amorphous NN particle, and barium titanate was prepared and then bonded by thermal compression so as to have a thickness of 100 to 200 microns. Subsequently, an electrode layer was formed on the compression bonded green sheet. Specifically, a paste of Ag and Pd (Ag:Pd=7:3) was applied onto the green sheet by the screen printing method. After drying the sample, the green sheets were laminated one on top of another so as to be—/green sheet/electrode/green sheet/—. The laminated green sheets were bonded by thermal compression under a pressure of 30 MPa at 80° C. The thermal compression bonded green sheets were cut into appropriate size pieces, and sintered at 1,150° C. The obtained laminated ceramics was a solid solution of (100)-oriented NN and barium titanate.

EXAMPLE 14

In Example 12, copper oxide (general formula: CuO) powder at a concentration of 0.25 to 1 mol % with respect to NN was added into the slurry used in the doctor blade method. An oriented ceramics was also obtained when copper oxide powder was added. The addition of copper oxide powder allowed the sintering temperature of the piezoelectric ceramics to be lowered by at least 25° C. In addition, the insulation resistance of the piezoelectric ceramics after the sintering was two times or more higher than that in the case where the copper oxide powder was not added.

EXAMPLE 15

The cuboidal NN particle having an average side length of 3 to 20 μm and prepared in each of Examples 1 to 5 was placed on a substrate and then subjected to vibration. The degree of the vibration is such that the vibration can be slightly observed visually. A small vibrator (for example, Vibratory Packer VP type, manufactured by Sinfonia Technology Co., Ltd.) or the like can be used. It was confirmed by X ray diffraction that the NN particle was (100)-oriented through the vibration. A compact was prepared by applying a pressure of 50 to 200 MPa to the oriented NN particle. An oriented ceramics of NN was able to be obtained by sintering the compact at 1,000 to 1,200° C.

EXAMPLE 16

First, a cuboidal barium titanate particle was prepared by the following procedures. Potassium carbonate (general formula: $K_2CO_3$) and rutile (general formula: $TiO_2$) powder were mixed at a mole ratio of 1:2, and then sintered at 700° C. for 6 hours to prepare $K_2Ti_2O_5$. $K_2Ti_2O_5$, $BaCl_2.6H_2O$, and $Ba(NO_3)_2$ were mixed at a mole ratio of 1:1:1, and then heated at 500 to 1,200° C. for 6 hours. In order to dissolve potassium and barium salts, the product was washed with distilled water and then washed with dilute nitric acid, followed by being filtered. The residue was washed with distilled water again and dried at 50° C. The obtained powder included a cuboidal barium titanate particle and had a mole ratio (Ba/Ti) of Ba to Ti of 1.00 according to ICP analysis. When the sintering temperature was 700 to 1,000° C., the obtained cuboidal barium titanate had an average side length of about 3 to 10 μm. When the sintering temperature was 1,000 to 1,200° C., the cuboidal barium titanate had an average side length of about 1 to 10 μm.

The cuboidal $BaTiO_3$ particle having an average side length of 1 to 10 μm prepared by the above-mentioned process was placed on a substrate and subjected to vibration. As in the case of Example 15, it was found that a (100)-oriented ceramics was obtained.

EXAMPLE 17

A cuboidal bismuth ferrate particle was prepared by a hydrothermal synthesis method exemplified below. $NaBiO_3.nH_2O$ and $Fe(NO_3)_3.9H_2O$ were mixed at 1:1 as raw materials, and placed together with KOH in an autoclave containing 40 ml of distilled water. A mole ratio of Bi:Fe:K was set to 1:1:15 to 300, and the autoclave was kept at 180 to 260° C. for 4 to 42 hours. The obtained powder was classified to take out bismuth ferrate, which was washed with distilled water two or more times. A cuboidal bismuth ferrate particle having an average side length of 100 to 500 μm was prepared by the hydrothermal synthesis method. The obtained bismuth ferrate particle was placed on a substrate and subjected to vibration. After the vibration, a compact was prepared and sintered in a manner similar to Example 15. As a result, it was found that a (100)-oriented ceramics was obtained.

EXAMPLE 18

A cuboidal bismuth sodium titanate particle was prepared by a hydrothermal synthesis method exemplified below. Anatase ($TiO_2$), bismuth oxide ($Bi_2O_3$), and sodium hydroxide were mixed at a mole ratio of Na:Bi:Ti=60:0.25:1 as raw materials, and placed in an autoclave containing 40 ml of distilled water. Then, the autoclave was kept at 180 to 260° C. for 48 to 96 hours. The obtained powder was classified to take out bismuth sodium titanate, which was washed with distilled water two or more times. A cuboidal bismuth sodium titanate particle having an average side length of about 1 mm was prepared by the hydrothermal synthesis method. The obtained bismuth sodium titanate particle was placed on a substrate and subjected to vibration. Then, a compact was prepared and sintered in a manner similar to Example 15. As a result, it was found that a (100)-oriented ceramics was obtained.

As described above, it is understandable that the method of manufacturing an oriented ceramics of the invention of the present application is versatile and excellent. The method of manufacturing a plate-like particle and the method of manufacturing an oriented ceramics described in Examples 6 to 18 and are summarized in Table 2. Any of the ceramics described in Examples 6 to 18 is an oriented ceramics having a Lotgering factor of 10% or more.

TABLE 2

| Example number | Raw material | Orientation method | (100)-oriented sample |
| --- | --- | --- | --- |
| Example 6 | Cuboidal $NaNbO_3$ particle | Doctor blade | $NaNbO_3$ plate-like particle |
| Example 7 | Cuboidal $NaNbO_3$ particle | Other | $NaNbO_3$ plate-like particle |
| Example 8 | Plate-like $NaNbO_3$ particle $BaTiO_3$ | Vibration + Pressure | $(Na_{0.88}Ba_{0.12})(Nb_{0.88}Ti_{0.12})O_3$ ceramics |
| Example 9 | Plate-like $NaNbO_3$ particle $KNbO_3$ | Vibration + Pressure | $(Na_{0.5}Ka_{0.5})NbO_3$ ceramics |
| Example 10 | (100)-oriented inorganic $NaNbO_3$ plate-like particle $BaTiO_3$ | Doctor blade | $(Na_{0.88}Ba_{0.12})(Nb_{0.88}Ti_{0.12})O_3$ ceramics |
| Example 11 | (100)-oriented inorganic $NaNbO_3$ plate-like particle $BaTiO_3$ | Doctor blade | $(Na_{0.88}Ba_{0.12})(Nb_{0.88}Ti_{0.12})O_3$ laminated ceramics |
| Example 12 | Cuboidal $NaNbO_3$ particle $BaTiO_3$ | Doctor blade | $(Na_{0.88}Ba_{0.12})(Nb_{0.88}Ti_{0.12})O_3$ ceramics |
| Example 13 | Cuboidal $NaNbO_3$ particle $BaTiO_3$ | Doctor blade | $(Na_{0.88}Ba_{0.12})(Nb_{0.88}Ti_{0.12})O_3$ laminated ceramics |
| Example 14 | Cuboidal $NaNbO_3$ particle $BaTiO_3$ $CuO$ | Doctor blade | $(Na_{0.88}Ba_{0.12})(Nb_{0.88}Ti_{0.12})O_3$ + 0.0025-001CuO ceramics |
| Example 15 | Cuboidal $NaNbO_3$ particle | Vibration + Pressure | $NaNbO_3$ ceramics |
| Example 16 | Cuboidal $BaTiO_3$ particle | Vibration + Pressure | $BaTiO_3$ ceramics |
| Example 17 | Cuboidal $BiFeO_3$ particle | Vibration + Pressure | $BiFeO_3$ ceramics |
| Example 18 | Cuboidal $(Bi_{0.5}Na_{0.5})TiO_3$ particle | Vibration + Pressure | $(Bi_{0.5}Na_{0.5})TiO_3$ ceramics |

INDUSTRIAL APPLICABILITY

The method of producing an oriented ceramics according to the present invention is applicable to orientation control of various ceramics. In particular, employing the method for a lead-free piezoelectric ceramics not only lessens the burden on the environment but also causes the exhibition of satisfactory piezoelectric property. Therefore, the oriented ceramics manufactured according to the present invention can be utilized with no problem in equipment which uses a large amount of piezoelectric ceramics, such as a liquid discharge head, an ultrasonic motor, and a dust removing device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-119009, filed May 27, 2011, which is hereby incorporated by reference herein in its entirety.

The invention claimed is:

1. A method of manufacturing an oriented ceramics, comprising:
    keeping an aqueous dispersion liquid containing sodium hydroxide having a concentration of 2M to 4M and amorphous niobium oxide prepared by a molten salt method in an atmosphere at a pressure of more than 0.1 MPa and a temperature of 141° C. to 260° C. for 1 to 100 hours to obtain sodium niobate powder;
    filling a mold with a powder containing plate-shaped particles comprising the sodium niobate powder and an organic binder;
    vibrating the mold to make the powder crystal-oriented;
    pressurizing the powder to produce a compact; and
    sintering the compact to obtain the oriented ceramics,
    wherein the plate-shaped particles have an aspect ratio of a width to a thickness (width/thickness) of three or more,
    wherein the plate-shaped particles are (100)-oriented in pseudo-cubic notation,
    wherein the sodium niobate powder has a shape of a cuboid having an average side length of 0.1 μm to 100 μm,
    wherein the sodium niobate powder comprises sodium niobate particles in which at least one face of the cuboid is (100)-oriented in pseudo-cubic notation, and
    wherein the sodium niobate particles have a perovskite single-phase structure.

2. A method of manufacturing an oriented ceramics, comprising:
    keeping an aqueous dispersion liquid containing sodium hydroxide having a concentration of 2M to 4M and amorphous niobium oxide prepared by a molten salt method in an atmosphere at a pressure of more than 0.1 MPa and a temperature of 141° C. to 260° C. for 1 to 100 hours to obtain cuboidal sodium niobate particles and an average side length of 1 μm to 100 μm;
    mounting a powder containing the cuboidal sodium niobate particles on a substrate;
    vibrating the substrate to make the powder crystal-oriented;
    producing a compact from the powder; and
    sintering the compact to obtain the oriented ceramics.

* * * * *